(12) United States Patent
Sun et al.

(10) Patent No.: US 8,477,495 B2
(45) Date of Patent: Jul. 2, 2013

(54) AIRFLOW GUIDE MEMBER AND ELECTRONIC DEVICE HAVING THE SAME

(75) Inventors: Zheng-Heng Sun, Tu-Cheng (TW); Xiao-Feng Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 263 days.

(21) Appl. No.: 13/111,979

(22) Filed: May 20, 2011

(65) Prior Publication Data

US 2012/0224325 A1 Sep. 6, 2012

(30) Foreign Application Priority Data

Mar. 1, 2011 (CN) .......................... 2011 1 0048548

(51) Int. Cl.
*H05K 7/20* (2006.01)

(52) U.S. Cl.
USPC . 361/695; 361/694; 361/679.47; 361/679.48; 361/679.54; 361/709; 361/710; 454/184

(58) Field of Classification Search
USPC .................. 361/679.47, 679.48, 679.54, 709, 361/710; 454/184
See application file for complete search history.

(56) References Cited

U.S. PATENT DOCUMENTS

| | | | | |
|---|---|---|---|---|
| 3,004,196 A * | 10/1961 | Drexel | | 257/717 |
| 4,707,726 A * | 11/1987 | Tinder | | 174/252 |
| 5,297,005 A * | 3/1994 | Gourdine | | 361/697 |
| 5,339,214 A * | 8/1994 | Nelson | | 361/695 |
| 5,422,787 A * | 6/1995 | Gourdine | | 361/697 |
| 5,504,650 A * | 4/1996 | Katsui et al. | | 361/697 |
| 5,597,035 A * | 1/1997 | Smith et al. | | 165/80.3 |
| 5,630,469 A * | 5/1997 | Butterbaugh et al. | | 165/80.3 |
| 6,137,680 A * | 10/2000 | Kodaira et al. | | 361/697 |
| 6,198,630 B1 * | 3/2001 | Cromwell | | 361/704 |
| 6,504,712 B2 * | 1/2003 | Akutsu et al. | | 361/679.54 |
| 6,654,244 B2 * | 11/2003 | Laufer et al. | | 361/695 |
| 6,707,675 B1 * | 3/2004 | Barsun et al. | | 361/704 |
| 6,798,663 B1 * | 9/2004 | Rubenstein | | 361/710 |
| 7,002,797 B1 * | 2/2006 | Wittig | | 361/695 |
| 7,372,147 B2 * | 5/2008 | Dai et al. | | 257/707 |
| 7,742,295 B2 * | 6/2010 | Hata et al. | | 361/679.47 |
| 8,179,679 B2 * | 5/2012 | Slagle | | 361/720 |
| 2001/0023759 A1 * | 9/2001 | Katsui | | 165/125 |
| 2002/0044424 A1 * | 4/2002 | Hashimoto et al. | | 361/709 |
| 2002/0172008 A1 * | 11/2002 | Michael | | 361/697 |
| 2002/0179285 A1 * | 12/2002 | Sas et al. | | 165/80.3 |
| 2003/0116302 A1 * | 6/2003 | Sauciuc et al. | | 165/10 |
| 2003/0210525 A1 * | 11/2003 | Chung et al. | | 361/695 |
| 2004/0080912 A1 * | 4/2004 | Goth et al. | | 361/699 |
| 2004/0150959 A1 * | 8/2004 | Sullivan | | 361/728 |
| 2005/0041392 A1 * | 2/2005 | Chen | | 361/695 |
| 2006/0061966 A1 * | 3/2006 | Korinsky et al. | | 361/695 |
| 2006/0181851 A1 * | 8/2006 | Frank et al. | | 361/700 |
| 2006/0221570 A1 * | 10/2006 | Yang et al. | | 361/697 |

(Continued)

*Primary Examiner* — Anatoly Vortman
(74) *Attorney, Agent, or Firm* — Altis Law Group, Inc.

(57) ABSTRACT

An electronic device includes a bottom plate, a circuit board having an electronic component, a fan, and an airflow guide member. The circuit board is fixed to the bottom plate. The fan is arranged at the front of the circuit board. The airflow guide member is arranged between the fan and the circuit board. The airflow guide member includes an airflow guide wall defining a number of spaced slots, and a number of stop plates selectively inserted into the corresponding slots of the airflow guide wall, to leave some of the slots directly in front of the bottom of the electronic component open.

16 Claims, 5 Drawing Sheets

U.S. PATENT DOCUMENTS

| | | | |
|---|---|---|---|
| 2007/0117502 A1* | 5/2007 | Kim | 454/139 |
| 2008/0101017 A1* | 5/2008 | Hata et al. | 361/690 |
| 2008/0165498 A1* | 7/2008 | Gallina et al. | 361/697 |
| 2010/0073877 A1* | 3/2010 | Yu et al. | 361/697 |
| 2011/0026223 A1* | 2/2011 | Kaneko | 361/692 |
| 2012/0218708 A1* | 8/2012 | Sun | 361/695 |

* cited by examiner

AIRFLOW GUIDE MEMBER AND ELECTRONIC DEVICE HAVING THE SAME

CROSS-REFERENCE TO RELATED APPLICATIONS

Relevant subject matter is disclosed in a co-pending U.S. patent application (U.S. application Ser. No. 13/111,978) filed on the same date and having a same title with the present application, which is assigned to the same assignee as named herein.

BACKGROUND

1. Technical Field

The present disclosure relates to an airflow guide member and an electronic device having the airflow guide member.

2. Description of Related Art

Typically, a fan is mounted in an electronic device to direct air from outside into the electronic device, for forming airflow in a direction to cool a plurality of electronic components on a motherboard mounted in the electronic device. However, some of the air is blown underneath the motherboard where it is not effective in heat dissipation.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
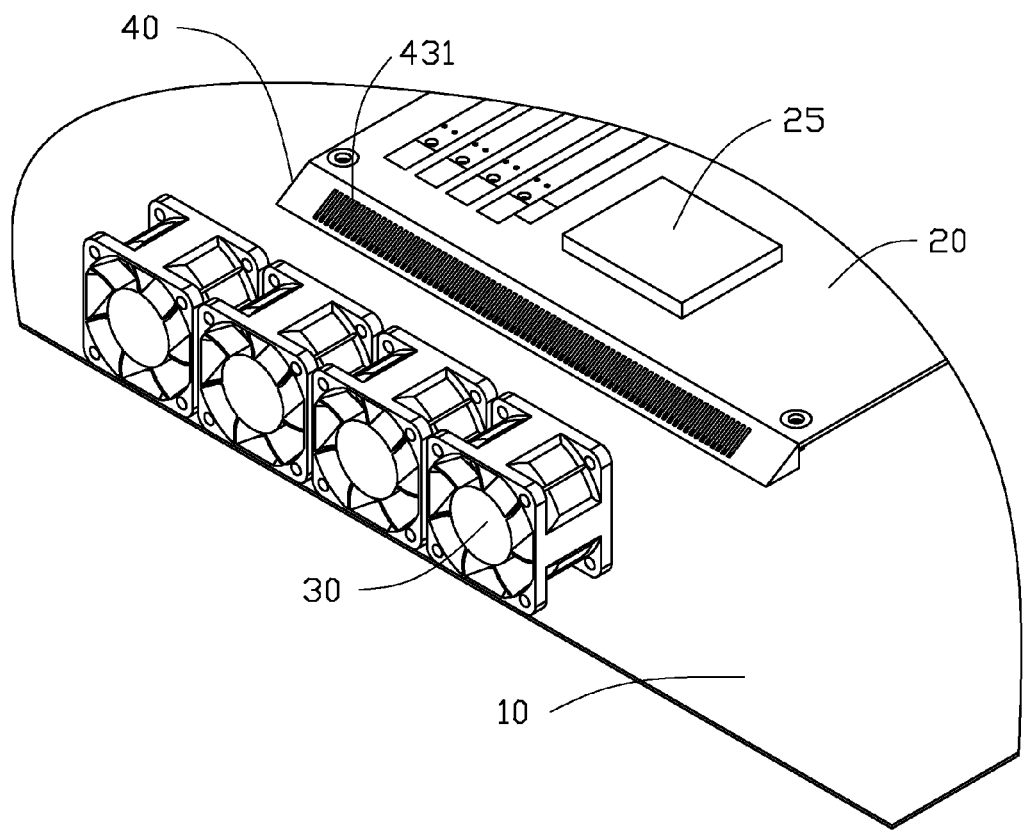
FIG. 1 is an assembled, isometric view of an embodiment of an electronic device, the electronic device including an airflow guide member.
Figure 2:
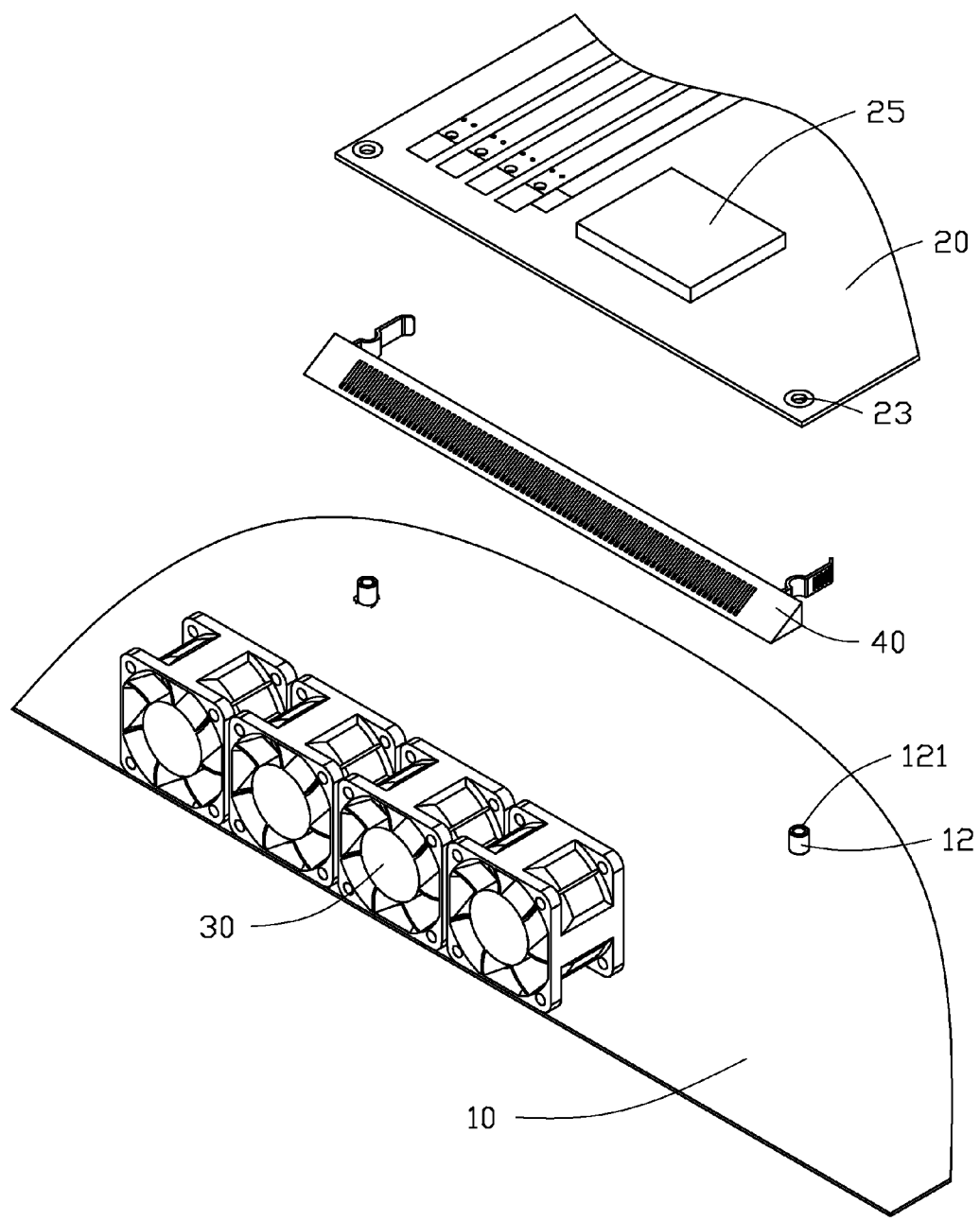
FIG. 2 is an exploded, isometric view of FIG. 1.

Referring to FIGS. 1 and 2, an embodiment of an electronic device includes a bottom plate 10, a circuit board 20, a plurality of fans 30, and an airflow guide member 40.

A plurality of posts 12 is formed on the bottom plate 10. A threaded hole 121 is defined in each post 12.

A plurality of fixing holes 23 is defined in the circuit board 20 corresponding to the threaded holes 121 of the bottom plate 10. An electronic component 25 is installed on the circuit board 20.

Figure 3:
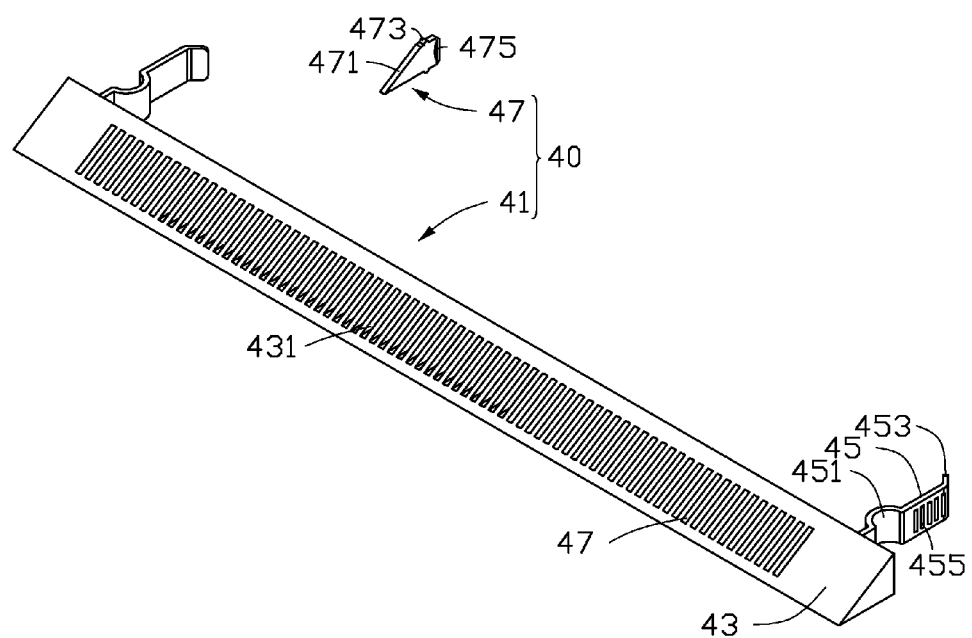
FIG. 3 is an exploded, isometric view of the airflow guide member of FIG. 2.
Figure 4:
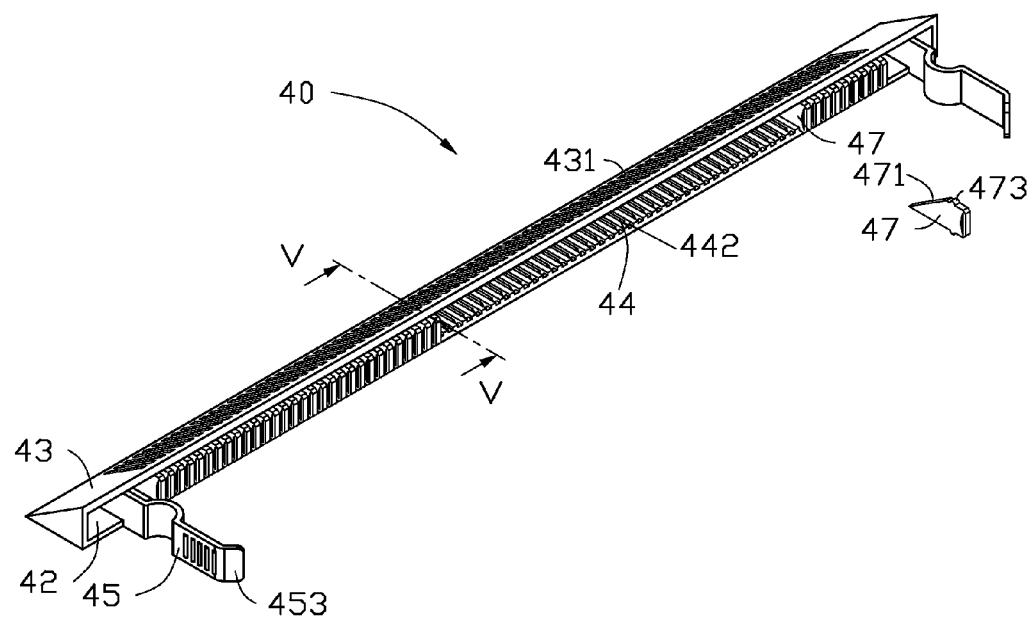
FIG. 4 is similar to FIG. 3, but viewed from another perspective.
Figure 5:
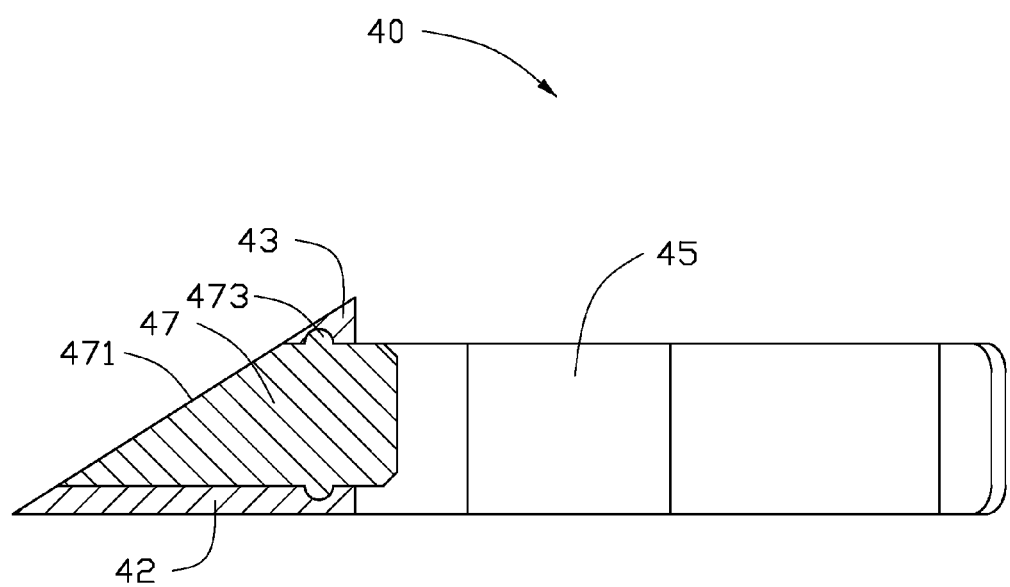
FIG. 5 is a cross-sectional view taken along the line V-V of FIG. 4.

Referring to FIGS. 3 and 4, the airflow guide member 40 includes a hollow main body 41, and a plurality of stop plates 47.

The main body 41 includes an elongated bottom wall 42, an elongated airflow guide wall 43 slantingly extending up from a front long side of the bottom wall 42, and two resilient arms 45 extending rearwards from a slanted face-down surface of the airflow guide wall 43 adjacent to opposite ends of the airflow guide wall 43. A plurality of lengthwise spaced slots 431 is defined in the airflow guide wall 43 through the main body 41. The number of the slots 431 is greater than the number of the stop plates 47. A number of grooves 44 are respectively defined in the bottom wall 42 right below the slots 431 and the slanted face-down surface of the airflow guide wall 43 right behind the slots 431. Rear ends of the grooves 44 extend through rear sides of the corresponding bottom wall 42 and the airflow guide wall 43, respectively. A concavity 442 is defined in a bottom of each groove 44. Middle sections of the resilient arms 45 are bent towards each other, and respectively form an arc-shaped hook 451. Distal ends of the resilient arms 45 are bent towards each other, and respectively form a slanted surface 453. A plurality of skid-resistant protrusions 455 is formed on an outer surface of each resilient arm 45 between the corresponding hook 451 and slanted surface 453.

Each stop plate 47 is substantially trapezoid-shaped, and an inclined surface 471 extending up and back is formed on a front side of the stop plate 47. The incline angle of the inclined surface 471 is equal to the incline angle of the airflow guide wall 43 of the main body 41. Two arc-shaped protrusions 473 are respectively formed on top and bottom portions of each stop plate 47. Two operable notches 475 are respectively defined in opposite sides of each stop plate 47 away from the corresponding inclined surface 471.

The stop plates 47 can be selectively inserted into the main body 41, with the top and bottom portions of each stop plate 47 received in the corresponding grooves 44 of the airflow guide wall 43 and the bottom wall 42, and the protrusions 473 of each stop plate 47 engaging in the concavities 442 of the corresponding grooves 44. The front side of each stop plate 47 is inserted into the corresponding slot 431 of the airflow guide wall 43, with the inclined surface 471 on the same plane with a slanted face-up surface of the airflow guide wall 43. Thereby, the slots 431 are selectively blocked by the stop plates 47.

In assembly, the circuit board 20 is placed on the posts 12 of the bottom plate 10. A number of screws (not shown) are respectively extended through the fixing holes 23 and engaged in the corresponding threaded holes 121, to fix the circuit board 20 to the bottom plate 10. The fans 30 are arranged on the bottom plate 10 at the front of the circuit board 20. The airflow guide member 40 is arranged between the circuit board 20 and the fans 30, with the airflow guide wall 43 facing the fans 30, and the slanted surface 453 aligning with two corresponding posts 12 adjacent to the fans 30. According to the position of the electronic component 25, the stop plates 47 are selectively inserted into the main body 41, to allow some of the slots 431 directly in front of the bottom of the electronic component 25 not to be blocked by the stop plates 47, and the other slots 431 to be blocked by the inserted stop plates 47. The airflow guide member 40 is pushed towards the circuit board 20, to allow the resilient arms 45 to be inserted into a space between the circuit board 20 and bottom plate 10. The slanted surfaces 453 abut against the corresponding posts 12 and deform the resilient arms 45 towards each other, until the hooks 451 align with the corresponding posts 12, respectively. The resilient arms 45 restore, and the corresponding posts 12 respectively engage in the hooks 451, fixing the airflow guide member 40 to the bottom plate 10. A rear side of the airflow guide wall 43 abuts against a front side of the circuit board 20.

When the electronic device works, the fans 30 blow air to the circuit board 20. Some of the airflow directly flows over the circuit board 20, and some of the airflow passes over the airflow guide wall 43 and the inclined surface 471 of the stop plates 47 and then flows over the circuit board 20. The airflow above the circuit board 20 can provide efficient heat dissipation for the electronic component 25 and other heat generating elements installed on the circuit board 20. A little of the airflow goes through the slots 431 unblocked by the stop plates 47, and flows underneath the circuit board 20, to dissipate heat for the electronic component 25 from a bottom surface of the circuit board 20. In this embodiment, the airflow guide member 40 can guide most of the airflow upwards to the top of the circuit board 20, and allow just a minimum portion of the airflow to flow underneath the circuit board 20, which improves effectiveness of the airflow and enhances heat dissipation efficiency of the electronic device.

To detach the airflow guide member 40 from the bottom plate 10, the sections of the resilient arms 45 having the skid-resistant protrusions 455 are pressed toward each other, to allow the hooks 451 of the resilient arms 45 to be disengaged from the corresponding posts 12. Thereby, the airflow guide member 40 can be detached.

In other embodiments, to save money on materials, the resilient arms 45 of the airflow guide member 40 can be omitted, and the airflow guide member 40 can be fixed to the bottom plate 10 through use of other fixing device, such as screws or latches.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An airflow guide member, comprising:
a hollow main body comprising an elongated bottom wall, and an elongated airflow guide wall slantingly extending up and back from a front long side of the bottom wall, a plurality of spaced slots defined in the airflow guide wall through the main body; and
a plurality of stop plates each with an inclined surface extending up and back formed on a front side thereof, the number of the stop plates is less than the number of the slots, the front sides of the stop plates selectively inserted into the slots of the airflow guide wall and leaving some of the slots open.

2. The airflow guide member of claim 1, wherein the slots are spaced in the lengthwise direction of the airflow guide wall.

3. The airflow guide member of claim 2, wherein the inclined surfaces of the stop plates are on the same plane with a slanted face-up surface of the airflow guide wall.

4. The airflow guide member of claim 3, wherein a plurality of grooves are respectively defined in the bottom wall right below the slots, a slanted face-down surface of the airflow guide wall is located right behind the slots, top and bottom portions of the stop plate are received in corresponding ones of the grooves of the airflow guide wall and the bottom wall.

5. The airflow guide member of claim 4, wherein a concavity is defined in a bottom of each of the grooves, two arc-shaped protrusions are respectively formed on the top and bottom portions of each stop plate, to engage in the concavities of the corresponding grooves of the airflow guide wall and the bottom wall.

6. The airflow guide member of claim 1, wherein the main body further comprises two resilient arms extending rearwards from the airflow guide wall, middle sections of the resilient arms are bent towards each other, and each forms an arc-shaped hook.

7. The airflow guide member of claim 6, wherein distal ends of the resilient arms are bent towards each other, and each forms a slanted surface.

8. The airflow guide member of claim 1, wherein two operable notches are respectively defined in opposite sides of each stop plate away from the corresponding inclined surface.

9. An electronic device, comprising:
a bottom plate;
a circuit board fixed to the bottom plate, with a space defined between the circuit board and the bottom plate, an electronic component installed on the circuit board;
a fan fixed to the bottom plate aligning with a front side of the circuit board; and
an airflow guide member fixed to the bottom plate between the fan and the circuit board, the airflow guide member comprising an elongated airflow guide wall slantingly extending up and abutting against the front side of the circuit board, and a plurality of stop plates, wherein a plurality of spaced slots is defined in the airflow guide wall, an inclined surface is formed on a front side of each of the stop plates, the front sides of the stop plates are selectively inserted into the corresponding slots of the airflow guide wall and leaving some of the slots directly in front of the bottom of the electronic component open.

10. The electronic device of claim 9, wherein the slots are spaced in the lengthwise direction of the airflow guide wall.

11. The electronic device of claim 10, wherein the inclined surfaces of the stop plates are on the same plane with a slanted face-up surface of the airflow guide wall.

12. The electronic device of claim 11, wherein the airflow guide member further comprises a bottom wall, the airflow guide wall slantingly extends up and back from a front long side of the bottom wall, a plurality of grooves are respectively defined in the bottom wall right below the slots, and a slanted face-down surface of the airflow guide wall right behind the slots, top and bottom portions of the stop plate are received in the corresponding grooves of the airflow guide wall and the bottom wall.

13. The electronic device of claim 12, wherein a concavity is defined in a bottom of each of the grooves, two arc-shaped protrusions are respectively formed on the top and bottom portions of each stop plate, to engage in the corresponding concavities of the airflow guide wall and the bottom wall.

14. The electronic device of claim 9, wherein a plurality of posts is formed on the bottom plate, the circuit board is fixed on the posts, the airflow guide member further comprises two resilient arms extending rearwards from the airflow guide wall, middle sections of the resilient arms are bent towards each other, and respectively form an arc-shaped hook, to engage with two corresponding posts of the bottom plate.

15. The electronic device of claim 14, wherein distal ends of the resilient arms are bent towards each other, and respectively form a slanted surface.

16. The electronic device of claim 9, wherein two operable notches are respectively defined in opposite sides of each stop plate away from the corresponding inclined surface.

* * * * *